United States Patent
Sato et al.

[11] 3,970,947
[45] July 20, 1976

[54] MULTI-STAGE DIFFERENTIAL AMPLIFIER CIRCUIT WITH MEANS FOR COMPENSATING THE TEMPERATURE DRIFT OF A CONSTANT CURRENT SOURCE TRANSISTOR

[75] Inventors: Itsuzo Sato; Kikuo Saito, both of Yokohama, Japan

[73] Assignee: Tokyo Shibaura Electric Co., Ltd., Kawasaki, Japan

[22] Filed: May 21, 1975

[21] Appl. No.: 579,703

[30] Foreign Application Priority Data
May 30, 1974  Japan.............................. 49-61162

[52] U.S. Cl............................... 330/23; 330/30 D; 330/69
[51] Int. Cl.² .......................................... H03F 1/32
[58] Field of Search...................... 330/23, 30 D, 69

[56] References Cited
UNITED STATES PATENTS
3,531,733  9/1970  Haines, Jr........................ 330/23 X
3,600,607  8/1971  Vatin ............................... 330/69 X Primary Examiner—R. V. Rolinec
Assistant Examiner—Lawrence J. Dahl
Attorney, Agent, or Firm—Oblon, Fisher, Spivak, McClelland & Maier

[57] ABSTRACT

A multi-stage differential amplifier circuit comprises a preceding stage differential amplifier and a succeeding stage differential amplifier which are direct-coupled in unbalanced configuration. A variation in the DC level at an output of the amplifier circuit due to the temperature drift of a constant current source transistor in the preceding stage differential amplifier is compensated by a bias circuit connected to the base of one of differential transistors in the succeeding stage differential amplifier. The compensation bias circuit includes a current source transistor the base of which is connected, together with the base of the current source transistor in the preceding stage differential amplifier, to a common drive voltage source.

8 Claims, 5 Drawing Figures

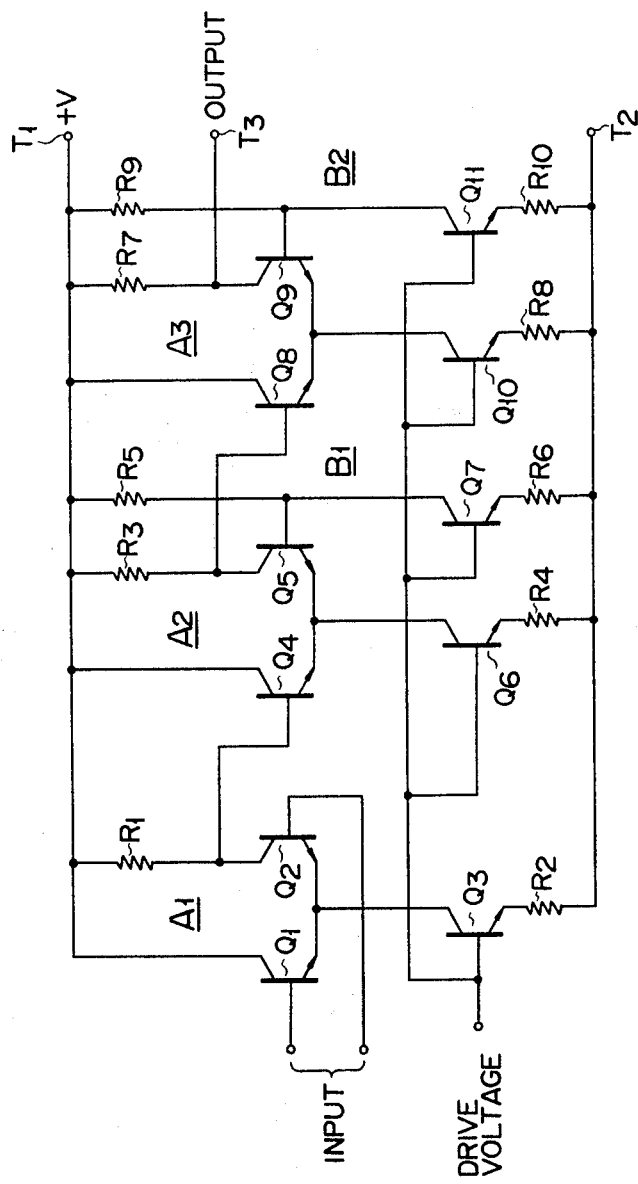
F I G. 3

MULTI-STAGE DIFFERENTIAL AMPLIFIER CIRCUIT WITH MEANS FOR COMPENSATING THE TEMPERATURE DRIFT OF A CONSTANT CURRENT SOURCE TRANSISTOR

This invention relates to a differential amplifier circuit, and in particular to a direct coupled multi-stage differential amplifier circuit having preceding and succeeding stage differential amplifiers connected in unbalanced configuration.

Conventionally known is a multistage differential amplifier circuit of the type in which preceding and succeeding stage differential amplifiers are cascade-connected in balanced configuration such that the collector outputs of a differential transistors in the preceding stage differential amplifier are coupled to the bases of differential transistors in the succeeding stage differential amplifier. A variation in the DC voltage level of the collector outputs owing to the temperature drift of a constant current source transistor coupled to the emitters of the differential transistors in the preceding stage differential amplifier is cancelled by the differential transistors in the immediately succeeding stage differential amplifier. As a result, the temperature drift of the current source transistor in the preceding stage differential amplifier presents no problem.

Also known is a multi-stage differential amplifier circuit of the type in which preceding and succeeding stage differential amplifiers are cascade-connected in unbalanced configuration such that a collector output of one of differential transistors in the preceding stage differential amplifier is coupled to the base of one of differential transistors in the immediately succeeding stage differential amplifier. In this case, the temperature drift of a current source transistor in the preceding stage differential amplifier is not cancelled by the differential transistors in the succeeding stage differential amplifier, and a DC voltage produced owing to such temperature drift are sequentially amplified, thus producing increased DC error voltage at the output of the final stage differential amplifier. For this reason, such a multi-stage differential amplifier circuit has not been widely used.

With a video signal processing circuit including, for example, a clip circuit, gamma circuit, filter circuit etc., however, it is desirable to use such multi-stage differential amplifier circuit of the unbalanced connection type, since the multi-stage differential amplifier circuit in balanced configuration requires due to the presence of a pair of signal lines a pair of clip circuits, gamma circuits, filter circuits etc. In practice it is very difficult to provide paired circuits with the same characteristics. To use a multi-stage differential amplifier in unbalanced configuration it is naturally contemplated to effect the temperature compensation of a constant current source transistor. It is true that the temperature compensation of a base-to-emitter voltage $V_{BE}$ of a current source transistor is relatively easily made, but it is very difficult to make temperature compensation of hfe (current amplification of a common emitter transistor).

It is accordingly the object of this invention to provide a multi-stage differential amplifier circuit of unbalanced connection type which can eliminate at a succeeding stage differential amplifier any influence resulting from the temperature drift of a current source transistor used in a preceding stage differential amplifier.

According to this invention to the base of one of differential transistors in the succeeding stage differential amplifier is connected a bias circuit comprising a current source transistor having the base coupled to the base of a current source transistor in the preceding stage differential amplifier, and a load resistor connected to the collector of the current source transistor in the succeeding stage differential amplifier. The voltage drop across the load resistor of the bias circuit is set to be made equal to a voltage drop across a load resistor of the preceding stage differential amplifier. If the current source transistors have the same temperature characteristics, the variations of a voltage across the load resistor of the preceding stage differential amplifier due to the temperature drift of the current source transistor in the preceding stage differential amplifier is made equal to the variation of a voltage across the load resistor of the bias circuit in the succeeding stage differential amplifier owing to the temperature drift of the current source transistor in the bias circuit of the succeeding stage differential amplifier, and thus the voltage variations at the load resistors of the preceding differential amplifier and the bias circuit can be cancelled by the differential transistors of the succeeding differential amplifier. The temperature drift of the constant current source transistor in the succeeding differential amplifier can be cancelled by a next succeeding differential amplifier having a compensating bias circuit.

Since according to this invention it is not necessary to make temperature compensation of the constant current source transistor per se, a temperature compensation circuit can be made simpler.

This invention can be more fully understood from the following detailed description when taken in conjunction with the accompanying drawings, in which:

FIG. 3 is a schematic circuit diagram showing a three-stage differential amplifier according to the embodiment of FIG. 1;

Figure 1:
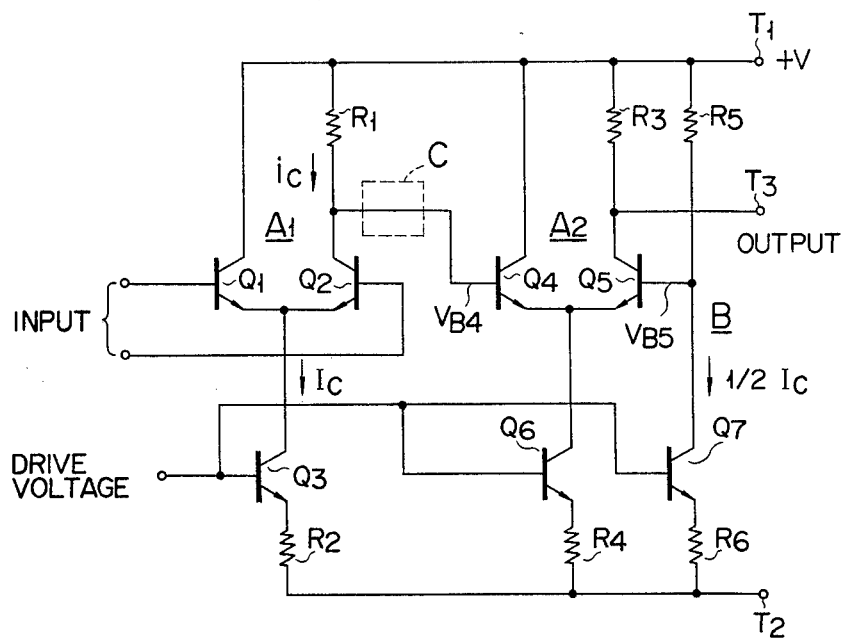
FIG. 1 is a schematic circuit diagram showing a two-stage differential amplifier circuit according to one embodiment of this invention.

In FIG. 1, a first differential amplifier A1 has, for example, a pair of NPN type transistors $Q_1$ and $Q_2$ connected in a common emitter configuration. The collector of the transistor $Q_1$ is connected to a first power supply terminal $T_1(+V)$, while the collector of the transistor $Q_2$ is connected through a load resistor $R_1$ to the terminal $T_1$. To each emitter of the paired transistors $Q_1$ and $Q_2$ connected the collector of an NPN type transistor $Q_3$ operating as a constant current source. The emitter of the constant current source transistor $Q_3$ is connected through an emitter current regulating resistor $R_2$ to a second power supply terminal $T_2$ (ground).

The bases of the paired transistors $Q_1$ and $Q_2$ connected in differential configuration are connected to receive a differential input signal. The base of the constant current source transistor $Q_3$ is connected to a drive voltage source.

A second differential amplifier A2 has, for example, a pair of NPN type transistors $Q_4$ and $Q_5$ connected in a common emitter configuration. The collector of the transistor $Q_4$ is connected to the first power supply terminal $T_1$ and the collector of the transistor $Q_5$ is connected through a load resistor $R_3$ to the first power supply terminal $T_1$.

To the emitter of the paired transistors $Q_4$ and $Q_5$ is connected the collector of an NPN type transistor $Q_6$ constituting a constant current source. The emitter of the constant current transistor $Q_6$ is connected through an emitter current regulating resistor $R_4$ to the second power supply terminal $T_2$. The constant current source transistor $Q_6$ has the base connected to the base of the constant current source transistor $Q_3$ in the first differential amplifier A1. Out of the differentially connected transistors $Q_4$ and $Q_5$ the transistor $Q_4$ has the base coupled to the output of the first differential amplifier A1 i.e. the collector of the transistor $Q_2$. That is, the first and second differential amplifiers A1 and A2 are cascade-connected in unbalanced configuration. The transistor $Q_5$ in the second differential amplifier A2 has the base connected to a bias circuit B. The bias circuit B includes a constant current source transistor $Q_7$ having the base connected to the base of the constant current source transistor $Q_3$, the emitter connected through an emitter current regulating resistor $R_6$ to the second power supply terminal $T_2$, and the collector connected to the base of the transistor $Q_5$ and through a load resistor $R_5$ to the first power supply terminal $T_1$. The collector of the transistor $Q_5$ is connected to an output terminal $T_3$.

The reference symbol C shows a processing circuit such as a clipping ciruict, or gamma circuit, which may be connected between the first and second differential amplifiers A1 and A2 in the case of a video signal processing circuit.

It will be evident that where the differential amplifier circuit according to this invention is used as a video processing circuit only the single processing circuit is required.

In the circuit arrangement of FIG. 1, no problem arises with respect to the differential transistors, since the temperature drifts of the paired transistors connected in differential configuration are automatically cancelled with respect to each other. However, the temperature drift of the constant current source transistor remains to be settled.

The elimination of temperature drift in the constant current source transistor $Q_3$ will now be explained by reference to FIG. 1.

It is preferred that, in an attempt to eliminate such temperature drift, the constant current source transistor $Q_3$ in the first differential amplifier A1 and the constant current source transistor $Q_7$ of the bias circuit B in the second differential amplifier A2 have the same temperature characteristic.

Let the collector current IC of the transistor $Q_3$ be represented by IC. The value of the emitter current regulating resistor $R_6$ is so selected as to make the collector current of the transistor $Q_7$ equal to ½ IC. Assume also that the load resistors $R_1$ and $R_2$ have the same value.

The transistor $Q_4$ in B4 second differential amplifier A2 has the base voltage $V_{B4}$ equal in value to the collector voltage of the transistor $Q_2$ in the first differential amplifier A1. That is, the base voltage of the transistor $Q_4$ has a value of V-icR$_1$ in which IC denotes the collector current of the transistor $Q_2$ which is considered as equal to one half the value of the collector current IC of the constant current source transistor $Q_3$. In consequence, the base voltage $V_{B4}$ of the transistor $Q_4$ is given as V-1/2IC·R$_1$, while the base voltage $V_{B5}$ of the transistor Q5 is given as V-1/2IC·R$_5$. Since $R_1 = R_5$, the paired transistors $Q_4$ and $Q_5$ in the second differential amplifier A2 have the same base voltage value.

This means that a variation in the output DC voltage of the first differential amplifier A1 due to the change of ambient temperature is equal to the variation of a DC voltage across the load resistor $R_5$ in the bias circuit B. These voltage variations can be cancelled by the paired transistors $Q_4$ and $Q_5$ connected in a differential configuration in a well known manner. Though the variation of the output DC voltage due to the temperature drift of the current source transistor $Q_3$ in the preceding stage differential amplifier A1 is eliminated at the succeeding differential amplifier A2 as mentioned above only the variation of output DC voltage due to the temperature drift of the current source transistor $Q_6$ in the succeeding differential amplifier A2 appears at the output terminal $T_3$. This output voltage variation, however, is far smaller than the variation of output voltage on the output terminal $T_3$ which would appear due to the temperature drift of the current source transistor $Q_6$ in the preceding stage differential amplifier when the temperature compensation is not made.

The differential amplifier ciruict of this invention can attain temperature compensation by making a voltage drop across the load resistor $R_1$ in the preceding stage differential amplifier equal to the voltage drop across the load resistor $R_5$ of the compensating current source transistor $Q_7$ in the succeeding stage differential amplifier. It is, therefore, not necessarily required that the load resistors $R_1$ and $R_5$ have the same value, With the collector current of the current source transistor $Q_7$ made equal to the collector current of the current source transistor $Q_3$ in the first differential amplifier A1, for example, the load resistor $R_5$ may be one half the load resistor $R_1$.

Where the above-mentioned differential amplifier circuit is fabricated in a monolithic type integrated circuit, transistors with very uniform characteristics can be easily obtained, thus assuring very effective temperature compensation.

Figure 2:
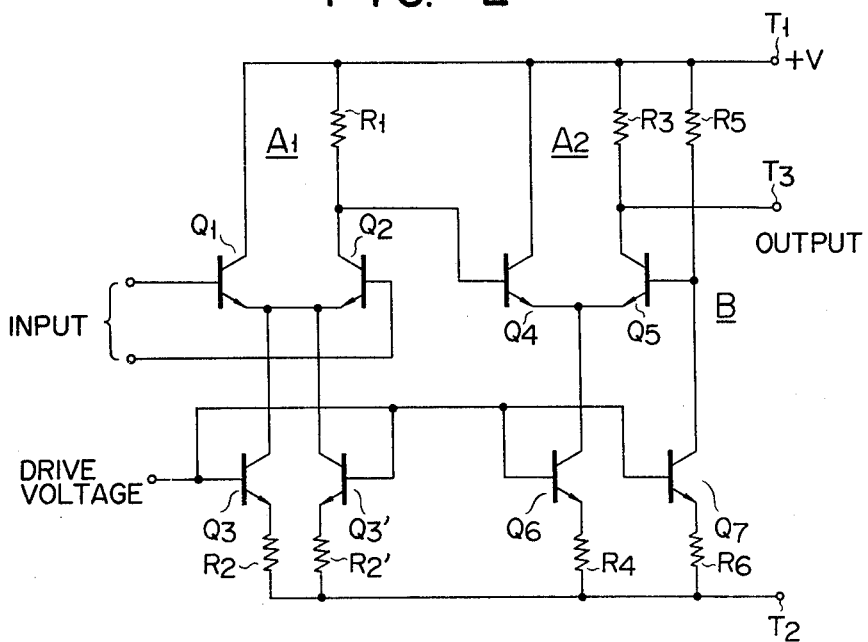
FIG. 2 is a schematic circuit diagram showing a modified circuit diagram similar to the embodiment of FIG. 1.

FIG. 2 shows a modified circuit of FIG. 1. In this modification, with the constant current source transistor $Q_3$ and emitter current regulating resistor $R_2$ in the first differential amplifier A1 are connected in parallel an additional constant current source transistor $Q_3'$ and emitter current regulating resistor $R_2'$. With this embodiment the collector currents of the transistors $Q_3$, $Q_3'$ and $Q_7$ may have the same value and, in consequence, the emitter current regulating resistors $R_2$, $R_2'$ and $R_6$ may have the same value, thus offering advantages in the manufacture of an integrated circuit.

FIG. 3 shows a three-stage differential amplifier circuit according to the embodiment of FIG. 1. To the output of the second differential amplifier A2 is connected a third differential amplifier A3 comprising differential transistors $Q_8$ and $Q_9$; a constant current source transistor $Q_{10}$; a load resistor $R_7$; an emitter current regulating resistor $R_8$; and a bias circuit B2 including a constant current source transistor $Q_{11}$ for compensation, a load resistor $R_9$ and an emitter current regulating resistor $R_{10}$. In this embodiment, the variation of output voltage owing to the temperature drift of the constant current source transistor $Q_6$ in the second differential amplifier A2 is compensated by the bias circuit B2 in the third differential amplifier A3. Even in this embodiment, only the variation of output voltage due to the temperature drift of the constant current source transistor $Q_{10}$ in the final stage differential amplifier appears at the output terminal $T_3$.

Figure 4:
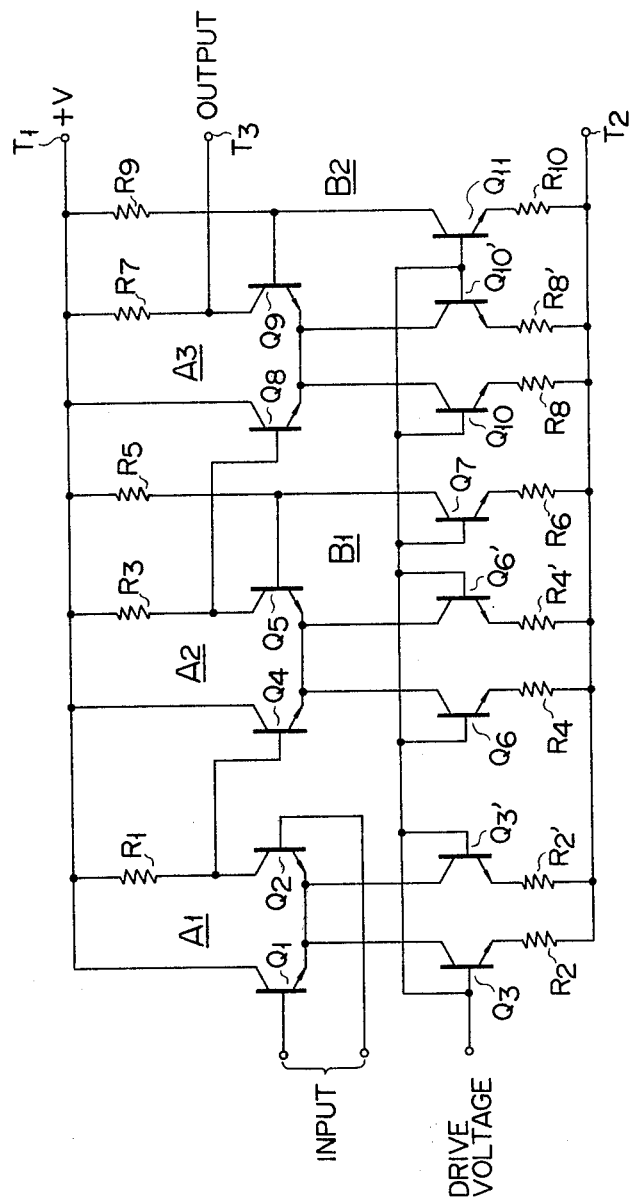
FIG. 4 is a schematic circuit diagram showing a three-stage differential amplifier according to the embodiment of FIG. 2.

FIG. 4 shows a three-stage differential amplifier, similar to the embodiment of FIG. 3, according to the differential amplifier as shown in FIG. 2. The three-stage differential amplifier is so arranged that in the first differential amplifier A1 a constant current source transistor $Q_3'$ and resistor $R_2'$ are connected in parallel with a constant current source transistor $Q_3$ and resistor $R_2$; in the second differential amplifier A2 a constant current source transistor $Q_6'$ and resistor $R_4'$ are connected in parallel with the constant current source transistor $Q_6'$ and resistor $R_4$; and in the third differential amplifier A3 a constant current source transistor $Q_{10}'$ and resistor $R_8'$ are connected in parallel with the constant current source transistor $Q_{10}$ and resistor $R_8$.

Figure 5:
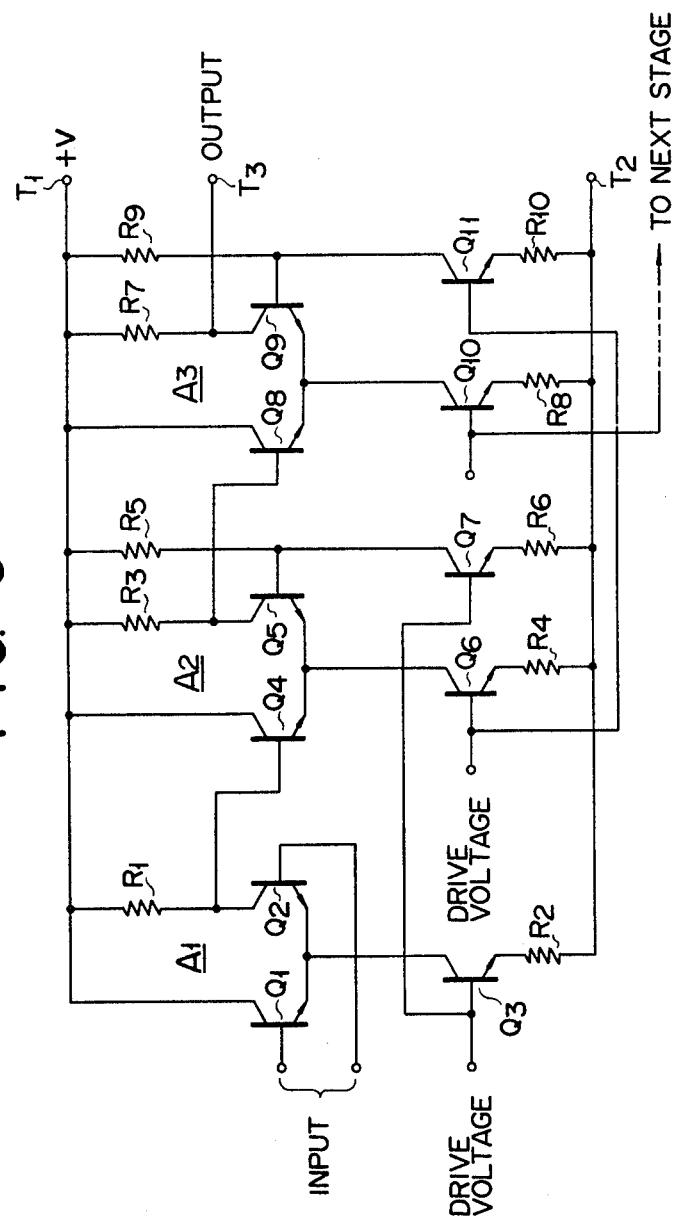
FIG. 5 shows a further modification of this invention.

Though with the above-mentioned embodiments the base of each constant current source transistor and of each constant current source transistor for compensation are connected in common to the common driving voltage source, this invention is not restricted to the above-mentioned connecting relation. According to this invention it is sufficient if the bases of the constant current source transistor in the preceding stage differential amplifier and the compensating constant current source transistor in the bias circuit of the immediately succeeding stage differential amplifier are connected in common. It is therefore possible to make such a connection as shown, for example, in FIG. 5. That is, the bases of transistors $Q_3$ and $Q_7$ may be connected in common with a first drive voltage source, and the bases of transistors $Q_6$ and $Q_{11}$ in common with a second drive voltage source. If the next succeeding differential amplifier is provided, the base of transistor $Q_{10}$, together with the base of a compensation transistor in a succeeding bias circuit, may be connected to a third drive voltage source.

It is to be noted that the base of transistor $Q_{10}$ may be connected, as required, to the base of the transistor $Q_3$ or $Q_6$.

What we claim is:

1. A multi stage differential amplifier circuit comprising:
   a first differential amplifier means including an output, first and second transistor means connected in a common emitter configuration, and a first current source transistor means coupled to the emitters of said first and second transistor means and having a base coupled to a drive voltage source; and
   a second differential amplifier means including an input coupled with the output of said first differential amplifier means, an output, third and fourth transistor means connected in a common emitter configuration, a base of said third transistor means being coupled with the input of said second differential amplifier means, and a bias circuit means operative to apply a bias voltage to a base of said fourth transistor means and including a second current source transistor means a base of which is coupled with the base of said first current source transistor means.

2. A differential amplifier circuit according to claim 1 wherein said bias circuit means comprises a load resistive impedance means coupled to the collector of said second current source transistor means, the junction of said load resistive impedance means and said second current source transistor means being coupled to the base of said fourth transistor means.

3. A differential amplifier circuit according to claim 1 further comprising a further current source transistor means coupled to the emitters of said first and second transistor means in parallel relation with said first current source transistor means, a base of said further current source transistor means being coupled to the base of said first current source transistor means.

4. A differential amplifier circuit according to claim 1 further comprising a third current source transistor means coupled with the emitters of said third and fourth transistor means, a base of said third current source transistor means being coupled to a driving voltage source; and a third differential amplifier means including fifth and sixth transistor means connected in a common emitter configuration, a base of said fifth transistor means being coupled with the output of said second differential amplifier means; and a bias circuit means operative to apply a bias voltage to the base of said sixth transistor means and including a fourth current source transistor having a base coupled with the base of said third current source transistor means.

5. A differential amplifier circuit according to claim 4 further comprising a further current source transistor means coupled to the emitters of said third and fourth transistor means in parallel relation to said third current source transistor means, a base of said further current source transistor means being coupled with the base of said third current source transistor means.

6. A differential amplifier circuit according to claim 1 wherein said second differential amplifier means comprises a third current source transistor means coupled to the emitters of said third and fourth transistor means, a base of said third current source transistor means being coupled with the base of said first current source transistor means.

7. A differential amplifier circuit according to claim 6 further comprising a third differential amplifier means including fifth and sixth transistor means connected in a common emitter configuration, a base of said fifth transistor means being coupled with the output of said second differential amplifier means; and circuit means operative to apply a bias voltage to a base of said sixth transistor means and including a fourth current source transistor means having a base coupled with the base of said third current source transistor means.

8. A multi-stage differential amplifier circuit comprising:
   a first differential amplifier means having an output, and a current source transistor means which causes a DC voltage variation at the output with temperature variation;
   a second differential amplifier means including first and second transistor means each having a base, collector and emitter and connected in differential configuration and means connected with the base of said first transistor means and operative to produce a DC voltage variation with temperature variation which is substantially the same as that at the output of said first differential amplifier means; and
   means for direct-coupling the output of said first differential amplifier means with the base of said second transistor means.

* * * * *